(12) United States Patent
Uppal et al.

(10) Patent No.: US 11,721,607 B2
(45) Date of Patent: Aug. 8, 2023

(54) INTEGRATED CIRCUIT ASSEMBLIES HAVING METAL FOAM STRUCTURES

(71) Applicant: INTEL CORPORATION, Santa Clara, CA (US)

(72) Inventors: Aastha Uppal, Chandler, AZ (US); Je-Young Chang, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 684 days.

(21) Appl. No.: 16/750,213

(22) Filed: Jan. 23, 2020

(65) Prior Publication Data

US 2021/0233832 A1 Jul. 29, 2021

(51) Int. Cl.
*H01L 23/42* (2006.01)
*H01L 21/56* (2006.01)

(52) U.S. Cl.
CPC ............... *H01L 23/42* (2013.01); *H01L 21/56* (2013.01)

(58) Field of Classification Search
CPC .............................. H01L 23/42; H01L 21/56
See application file for complete search history.

(56) References Cited

U.S. PATENT DOCUMENTS

| | | | | |
|---|---|---|---|---|
| 5,986,885 | A | * | 11/1999 | Wyland ............... H01L 23/4334 257/796 |
| 2013/0091868 | A1 | * | 4/2013 | Campbell .............. H05K 7/203 62/3.2 |

* cited by examiner

*Primary Examiner* — Peniel M Gumedzoe
(74) *Attorney, Agent, or Firm* — Essential Patents Group, LLP

(57) ABSTRACT

An integrated circuit assembly may be formed comprising an electronic substrate, at least one integrated circuit device electrically attached to the electronic substrate, a heat dissipation device, a thermal interface material between the at least one integrated circuit device and the heat dissipation device, and a metal foam surrounding the at least one integrated circuit device and contacting the thermal interface material. The integrated circuit assembly may further include a stiffener attached to the electronic substrate and surrounding the at least one integrated circuit device, wherein the metal foam is disposed between the stiffener, the at least one integrated circuit device, the electronic substrate, and the heat dissipation device.

20 Claims, 5 Drawing Sheets

INTEGRATED CIRCUIT ASSEMBLIES HAVING METAL FOAM STRUCTURES

TECHNICAL FIELD

Embodiments of the present description generally relate to the field of integrated circuit package fabrication, and, more specifically, to an integrated circuit assembly including at least one metal foam structure for shielding and/or for thermal interface material containment.

BACKGROUND

The integrated circuit industry is continually striving to produce ever faster, smaller, and thinner integrated circuit (IC) devices and packages for use in various electronic products, including, but not limited to, computer servers and portable products, such as portable computers, electronic tablets, cellular phones, digital cameras, and the like.

As these goals are achieved, the IC devices become smaller. Accordingly, the density of power consumption of electronic components within the IC devices has increased, which, in turn, increases the average junction temperature of the IC device. If the temperature of the IC device becomes too high, the integrated circuits may be damaged or destroyed. Thus, heat dissipation devices are used to remove heat from the IC devices in an IC package. In one example, at least one IC device may be mounted to a substrate and the heat dissipation device may be thermally attached to the at least one IC device with a thermal interface material (TIM) that is disposed between the IC device(s) and the heat dissipation device to form thermal contact therebetween. The distance between the IC device(s) and the heat dissipation device is known as the bond line thickness (BLT).

The TIM primarily serves two functions: 1) to provide a heat transfer path from the IC device(s) to the heat dissipation device, and 2) to help absorb stresses in the IC package caused by differing thermal expansions between the components therein. With regard to providing a heat transfer path, the thermal efficiency of the TIM is critical to effectively remove heat from the IC device(s). The TIM may include thermal greases, gap pads, polymers, and the like. Although these TIMs have advantages, they also have intrinsic material properties on exposure to thermo-mechanical stresses which can result in "failure modes". These failure modes can include voiding, which can result in delamination from the heat dissipation device and/or the IC device(s); hardening, which can lead to loss of adhesion that can also result in delamination from the heat dissipation device and/or the IC devices; and pump-out, where the TIM physically moves out from between the heat dissipation device and the IC device(s). The thermo-mechanical stresses that cause failure modes result from temperature cycles during the operation of the IC package, manufacturing processes, and shipping. The temperature cycles cause warpage in integrated circuit device(s) within the IC package when it heats and cools during operation. For example, in a standard IC package with one IC device, the heat dissipation device bottoms out at approximately the center of the IC device, due to the IC device's natural convex shape at room temperature. When the IC package is exposed to temperature gradients, the shape of the IC device changes from convex to flat or concave, which causes compression on the TIM at edges or sidewalls of the IC device. When the IC package returns to room temperature, the IC device returns to a convex shape creating an elongation of the TIM at the edge or sidewalls of the IC device. The mechanisms of compression and elongation may cause the previously discussed failure modes.

Furthermore, as IC products and packages become smaller, the IC devices within the products and packages are positioned closer to one another. Moreover, greater power levels are being used by the IC products and packages. The closeness of the IC devices and the increased power levels can give rise to problems with electromagnetic interference. Electromagnetic interference occurs when low-frequency electromagnetic fields are generated by the IC devices, which may interfere with the operation of other integrated circuits within the products or packages. Additionally, when wireless components are incorporated into the IC products and packages, high-frequency electromagnetic radiation is generated, which may also interfere with the operation of other integrated circuits within the products or packages.

One approach to reduce this interference is through the use of electromagnetic shielding structures (known as Faraday cages), such as frames, shields, or cages, which are highly electrically conductive structures that are grounded and enclose or surround a portion of selected IC devices within a product or package. Such structures not only contain electromagnetic fields generated by the IC device(s) that it encloses or surrounds, but also prevents external or ambient electromagnetic fields, such as radio frequency energy, from affecting the functionality of the enclosed IC device(s).

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
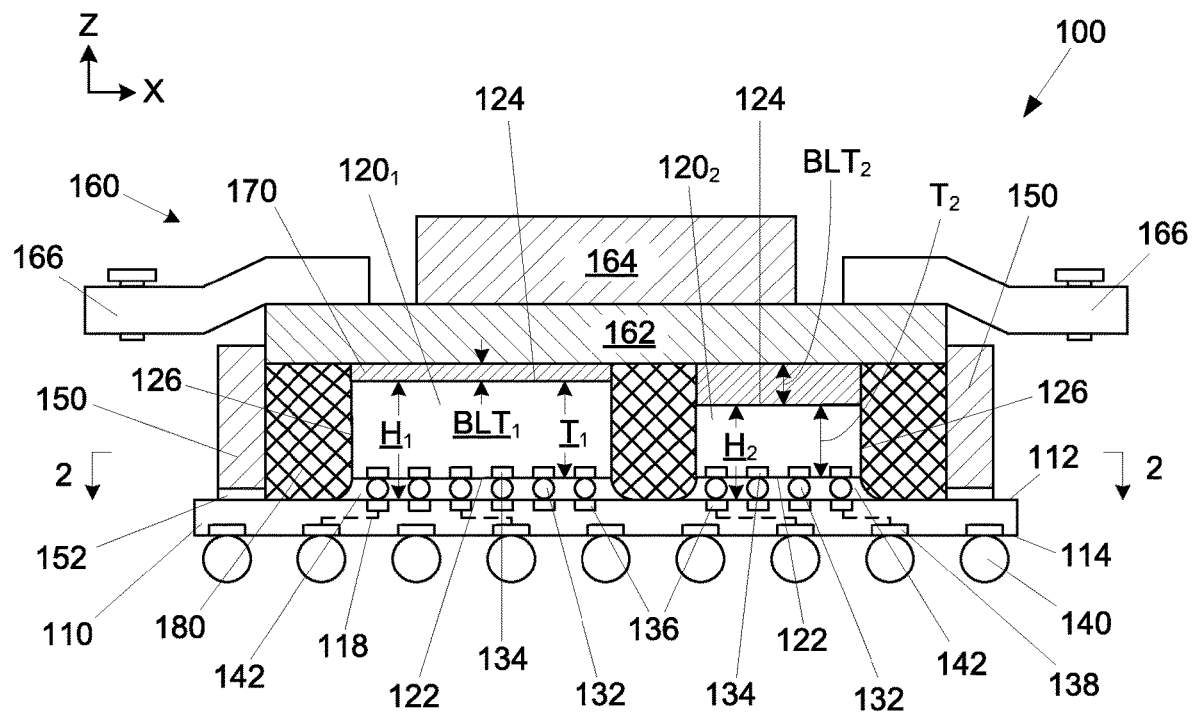
FIGS. 1 and 2 are a side cross-sectional view and a top plan view, respectively, of an integrated circuit package, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bond interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include an integrated circuit assembly comprising an electronic substrate, at least one integrated circuit device electrically attached to the electronic substrate, a heat dissipation device, a thermal interface material between the at least one integrated circuit device and the heat dissipation device, and a metal foam surrounding the at least one integrated circuit device and contacting the thermal interface material. The integrated circuit assembly may further include a stiffener attached to the electronic substrate and surrounding the at least one integrated circuit device, wherein the metal foam is disposed between the stiffener, the at least one integrated circuit device, the electronic substrate, and the heat dissipation device.

FIG. 1 illustrates an integrated circuit assembly 100 having at least one integrated circuit device (illustrated as a first integrated circuit device 120$_1$ and a second integrated circuit device 120$_2$) electrically attached to an electronic substrate 110 in a configuration generally known as a flip-chip or controlled collapse chip connection ("C4") configuration, according to an embodiment of the present description.

The electronic substrate 110 may be any appropriate structure, including, but not limited to, an interposer. The electronic substrate 110 may have a first surface 112 and an opposing second surface 114. The electronic substrate 110 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The electronic substrate 110 may further include conductive routes 118 or "metallization" (shown in dashed lines) extending through the electronic substrate 110. As will be understood to those skilled in the art, the conductive routes 118 may be a combination of conductive traces (not shown) and conductive vias (not shown) extending through the plurality of dielectric material layers (not shown). These conductive traces and conductive vias are well known in the art and are not shown in FIG. 1 for purposes of clarity. The conductive traces and the conductive vias may be made of any appropriate conductive material, including but not limited to, metals, such as copper, silver, nickel, gold, and aluminum, alloys thereof, and the like. As will be understood to those skilled in the art, the electronic substrate 110 may be a cored substrate or a coreless substrate.

The first integrated circuit device 120$_1$ and the second integrated circuit device 120$_2$ may be any appropriate device, including, but not limited to, a microprocessor, a chipset, a graphics device, a wireless device, a memory device, an application specific integrated circuit, combinations thereof, stacks thereof, or the like. As shown, the first integrated circuit device 120$_1$ and the second integrated circuit device 120$_2$ may each have a first surface 122, an opposing second surface 124, and at least one side 126 extending between the first surface 122 and the second surface 124.

As will be understood, when multiple integrated circuit devices are utilized, they may have different thicknesses. For example, as shown in FIG. 1, the first integrated circuit device 120$_1$ and the second integrated circuit device 120$_2$ may have differing thicknesses $T_1$ and $T_2$, respectively, that is measured from the first surface 122 to the second surface 124 of the first integrated circuit device 120$_1$ and the second integrated circuit device 120$_2$, respectively. The differing thickness $T_1$ and $T_2$ may result in differing heights $H_1$ and $H_2$ between the first integrated circuit device 120$_1$ and the second integrated circuit device 120$_2$, respectively, that is measured from the first surface 112 of the electronic substrate 110 to the second surface 124 of each of the first integrated circuit device 120$_1$ and the second integrated circuit device 120$_2$, which may result in differing bond line thickness $BLT_1$ and $BLT_2$, respectively.

In an embodiment of the present description, the first integrated circuit device 120$_1$ and the second integrated circuit device 120$_2$ may be electrically attached to the electronic substrate 110 with a plurality of device-to-substrate interconnects 132. In one embodiment of the present description, the device-to-substrate interconnects 132 may extend between bond pads 136 on the first surface 112 of the electronic substrate 110 and bond pads 134 on the first surface 122 of the integrated circuit device 120$_1$ and on the first surface 122 of the second integrated circuit device 120$_2$. The device-to-substrate interconnects 132 may be any appropriate electrically conductive material or structure, including, but not limited to, solder balls, metal bumps or pillars, metal filled epoxies, or a combination thereof. In one embodiment, the device-to-substrate interconnects 132 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 132 may be copper bumps or pillars. In a further embodiment, the device-to-substrate interconnects 132 may be metal bumps or pillars coated with a solder material.

The bond pads 134 may be in electrical communication with integrated circuitry (not shown) within their respective integrated circuit devices, i.e. the first integrated circuit device 120$_1$ and the second integrated circuit device 120$_2$. The bond pads 136 on the first surface 112 of the electronic substrate 110 may be in electrical contact with the conductive routes 118. The conductive routes 118 may extend through the electronic substrate 110 and be connected to bond pads 138 on the second surface 114 of the electronic substrate 110. As will be understood to those skilled in the art, the electronic substrate 110 may reroute a fine pitch (center-to-center distance between the bond pads) of the integrated circuit device bond pads 136 to a relatively wider pitch of the bond pads 138 on the second surface 114 of the electronic substrate 110. In one embodiment of the present description, external interconnects 140 may be disposed on the bond pads 138 on the second surface 114 of the electronic substrate 110. The external interconnects 140 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). The external interconnects 140 may be used to attach the integrated circuit assembly 100 to an external substrate (not shown), such as a motherboard.

An electrically-insulating underfill material 142, such as an epoxy material, may be disposed between the first integrated circuit device $120_1$ and the electronic substrate 110, and between the second integrated circuit device $120_2$ and the electronic substrate 110. The underfill material 142 may be used to overcome the mechanical stress issues that can arise from thermal expansion mismatch between the electronic substrate 110 and the integrated circuit devices $120_1$ and $120_2$. As will be understood to those skilled in the art, the underfill material 142 may be dispensed between the first surfaces 122 of the integrated circuit devices $120_1$, $120_2$, respectively, and the electronic substrate 110 as a viscous liquid and then hardened with a curing process.

Figure 2:
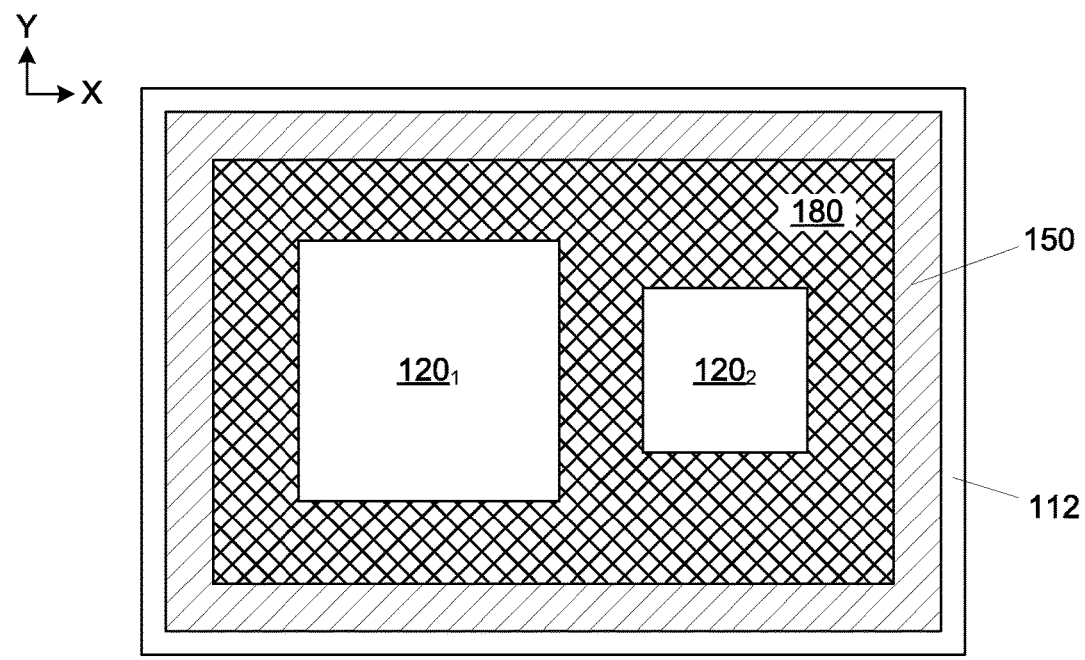

The integrated circuit assembly 100 may further include at least one stiffener 150 attached to the first surface 112 of the electronic substrate 110 to improve the structural integrity of the integrated circuit assembly 100 and to also overcome the mechanical stress issues that can arise from thermal expansion mismatch between the electronic substrate 110 and the integrated circuit devices $120_1$ and $120_2$. In one embodiment of the present description, as shown in FIG. 2, the at least one stiffener 150 may be a single "picture frame" structure surrounding the first integrated circuit device $120_1$ and the second integrated circuit device $120_2$. The at least one stiffener 150 may be attached to the first surface 112 of the electronic substrate 110 with an attachment adhesive 152. The at least one stiffener 150 may be fabricated from any appropriate, substantially rigid material, including, but not limited to, metal, plastics, and the like.

As further shown in FIG. 1, integrated circuit assembly may further include a heat dissipation device 160 comprising a cold plate 162 that may be thermally coupled with the second surface 124 of the first integrated circuit device $120_1$ and the second surface 124 of the second integrated circuit device $120_2$ with a thermal interface material 170. The cold plate 162 of the heat dissipation device 160 may be made of any appropriate thermally conductive material, including, but not limited to at least one metal material and alloys of more than one metal, or highly doped glass or highly, conductive ceramic material, such as aluminum nitride. In a specific embodiment of the present description, the cold plate 162 of the heat dissipation device 160 may comprise copper, nickel, aluminum, alloys thereof, laminated metals including coated materials (such as nickel coated copper), and the like.

As shown in FIG. 1, the heat dissipation device 160 may have additional thermal management devices 164 attached to the cold plate 162 to enhance heat removal. Such additional thermal management devices may include, but are not limited to, heat pipes, high surface area dissipation structures with a fan (such as a structure having fins or pillars/columns formed in a thermally conductive structure), liquid cooling devices, and the like, as will be understood to those skilled in the art. Furthermore, the thermal management device 160 may include external attachment devices 166 for attachment to external structures (not shown) to secure the heat dissipation device 160 and for maintaining a desired distance (e.g. bond line thickness $BLT_1$ and $BLT_2$) between the heat dissipation device 160 and second surfaces 124 of the integrated circuit devices $120_1$, $120_2$.

In various embodiments of the present description, the thermal interface material 170 may be any appropriate, thermally conductive material, including, but not limited to, a thermal grease, a thermal gap pads, a polymer, an epoxy filled with high thermal conductivity fillers, such as metal particles or silicon particles, and the like. In one embodiment of the present description, the thermal interface material 180 may be a phase change material. A phase change material is a substance with a high heat of fusion, which, when it melts and solidifies, is capable of storing and releasing large amounts of thermal energy. In an embodiment of the present description, the phase change material may include, but not limited to, nonadecane, decanoic (capric) acid, eicosane, dodecanoic (lauric) acid, docosane, paraffin wax, stearic acid, tetradecanoic (myristic) acid, octadecanol, hexadecanoic (palmitic) acid, and metallic alloys which include one or more of bismuth, lead, tin, cadmium, antimony, indium, thallium, tellurium, selenium, gallium, mercury, and combinations thereof.

As shown in FIG. 1, a metal foam 180 may be placed to contact the first surface 112 of the electronic substrate 110, the heat dissipation device 160, the side 126 of at least one integrated circuit device (e.g. integrated circuit devices $120_1$ and $120_2$), and the thermal interface material 170. The metal foam 180 may further contact the stiffener 150 and/or the underfill material 142. In one embodiment of the present description, as shown in FIG. 2, the metal foam 180 may substantially surround the at least one integrated circuit device (e.g. integrated circuit devices $120_1$ and $120_2$) in the X-Y directions. As further shown in FIG. 2, the metal foam 180 may be disposed between the integrated circuit devices (i.e. between the first integrated circuit device $120_1$ and second integrated circuit device $120_2$), when multiple integrated circuit devices are used in the integrated circuit assembly 100.

Figure 3:
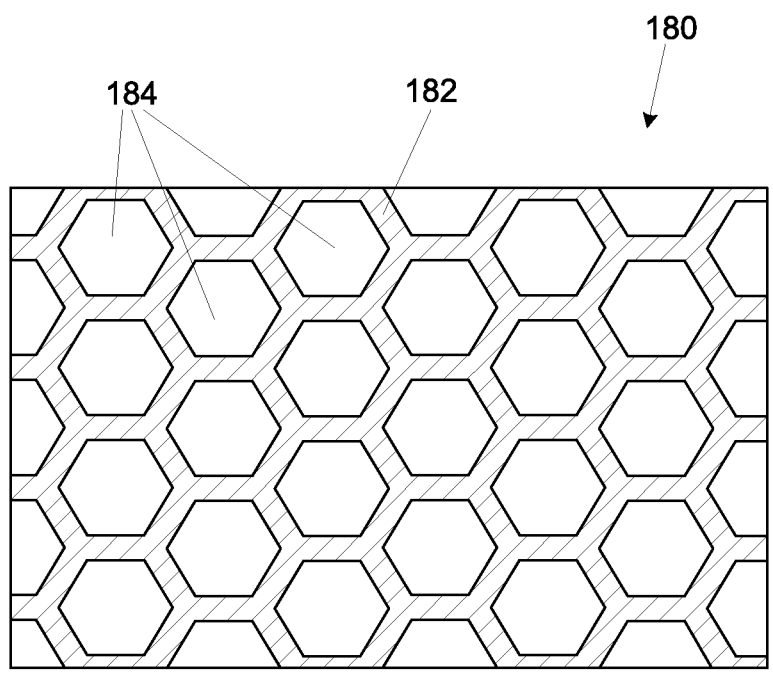
FIG. 3 is a cross-sectional view of a metal foam structure comprising a metal matrix, according to an embodiment of the present description.
Figure 4:
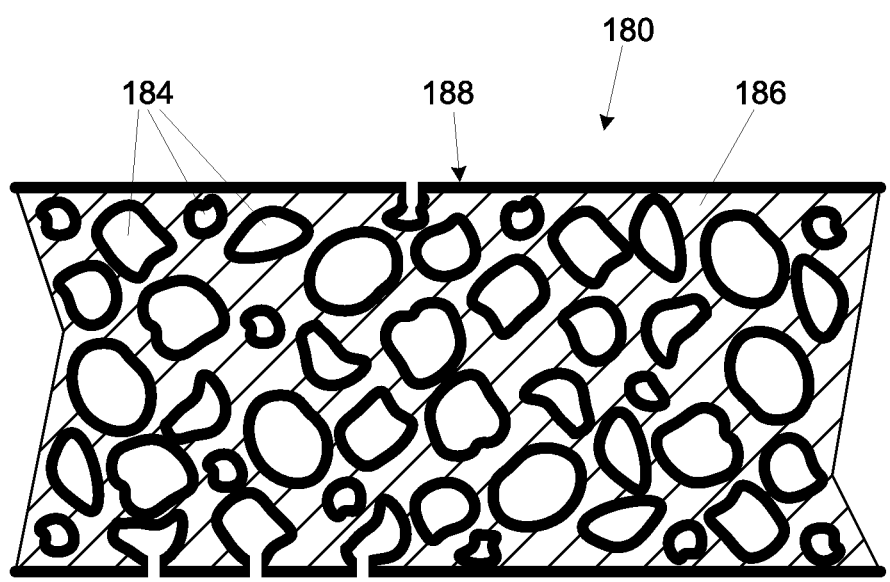
FIG. 4 is a cross-sectional view of a metal foam structure comprising a metal coated foam matrix, according to another embodiment of the present description.

The metal foam 180 may be a cellular structure which may be a solid metal matrix 182 with a plurality of cells 184, such as shown in FIG. 3, or may be a nonmetallic foam structure 186 with the plurality of cells 184, wherein the plurality of cells 184 are coated with a metal layer 188, such as shown in FIG. 4. The metal foam 180 may be either an open cell or a closed cell foam. An open cell foam is defined to be a foam wherein a portion of the cells are open to other cells and/or the outside atmosphere. A closed cell foam is defined to be a foam in which the cells are enclosed by their own wall and do not interconnect with other cells in the foam. In an embodiment of the present description, the metal foam 180 may be resilient, e.g. it may be subjected to a compression force, a stretching (elongation) force and/or a twisting (rotational torsion) force, and return substantially to its original shape when the force(s) are released. In one embodiment of the present description, the metal foam 180 may have ordered or uniform cells 184 of substantially the same size and shape, such as shown in FIG. 3, which may be fabricated by molding, 3-D printing, or the like. In another embodiment of the present description, the metal foam 180 may have non-ordered cells 184 of differing size and shape, such as shown in FIG. 4, which may be fabricated by injecting gas into a liquid metal or liquid foam structure material, by causing gas formation in the liquid metal or liquid foam structure material, by causing the precipitation of gas dissolved in the liquid metal or liquid foam structure material, or the like.

The solid metal matrix 182 and the metal layer 188 may be any appropriate metal, including, but not limited to, aluminum, copper, nickel, alloys thereof, and the like. The non-metallic foam structure 186 may be any appropriate material, including, but not limited to, urethane, glass, ceramic, polymers thereof, and the like. In an embodiment of the present description, the metal foam 180 may have the plurality of cells 184 comprising between about 50% and 95% of the volume of the metal foam 180, and may have a density between about 100 and 4500 kg/m$^3$ (kilograms per cubic meter). The selection of type of metal form 180, the materials used to fabricate the metal foam 180, and size of the cells 184 can be made depending upon mechanical requirements, as well as compatibility of the thermal interface material 170 with the metal foam 180.

When the metallic foam 180 is used in an integrated circuit assembly 110 according to the embodiments of the present description, issues related to electromagnetic interference/radio frequency interference (EMI/RFI) shielding, issues related to thermal interface material 170 reliability, and issues related to thermomechanical stresses may be addressed, such as minimizing the damage risk to integrated circuit devices 120$_1$, 120$_2$ due to manufacturing variations in the heat dissipation device 160 and assembly processes, as will be understood to those skilled in the art, may be addressed.

With regard to EMI/RFI shielding, the formation of the metal foam 160 to substantially surround the at least one integrated circuit device 120$_1$, 120$_2$ results in a faraday cage which may protect the at least one integrated circuit device 120$_1$, 120$_2$ from EMI/RFI and/or prevent EMI/RFI from being emitted by the at least one integrated circuit device 120$_1$, 120$_2$. In particular, the metal foam 160 between integrated circuit devices (such as between the first integrated circuit device 120$_1$ and the second integrated circuit 120$_2$) may prevent interfere therebetween.

With regard to thermal interface material 170 reliability, as the integrated circuit assembly 110 goes through temperature cycling and warpage occurs, the thermal interface material 170 may squeeze or pump out from between the heat dissipation device 160 and the at least one integrated circuit device 120$_1$, 120$_2$, which may lead to voids in the thermal interface material 170 thereby increasing thermal resistance, as previously discussed. The formation of the metal foam 160 to substantially surround the at least one integrated circuit device 120$_1$, 120$_2$ results in the foam metal 180 acting as a barrier to prevent the thermal interface material 170 from squeezing or pumping out, and any thermal interface material 170 that does squeeze or pump out will be contained within the cells 184 and can be restored back during the thermal cycling and, thus, prevent degradation. Therefore, the use of the metal foam 170 will allow for a greater variety of types of thermal interface materials 170 and provides flexibility with different die heights $H_1$, $H_2$ and different bond line thickness $BLT_1$, $BLT_2$ requirements.

Figure 5:
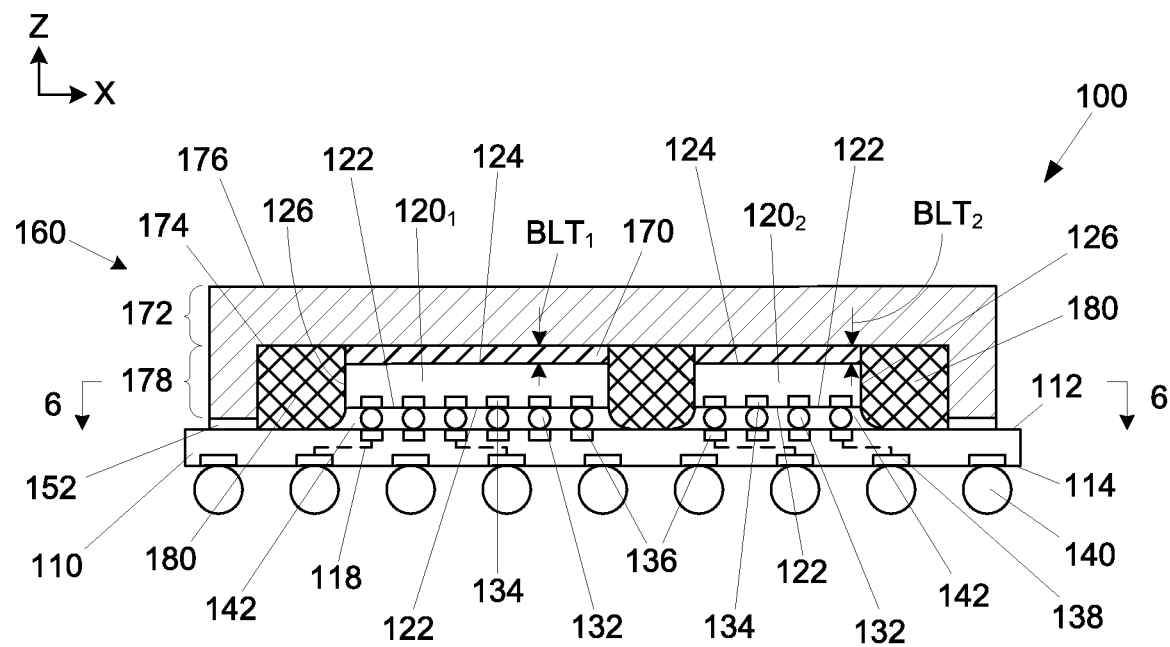
FIGS. 5 and 6 are a side cross-sectional view and a top plan view, respectively, of a multi-device integrated circuit package, according to one embodiment of the present description.
Figure 6:
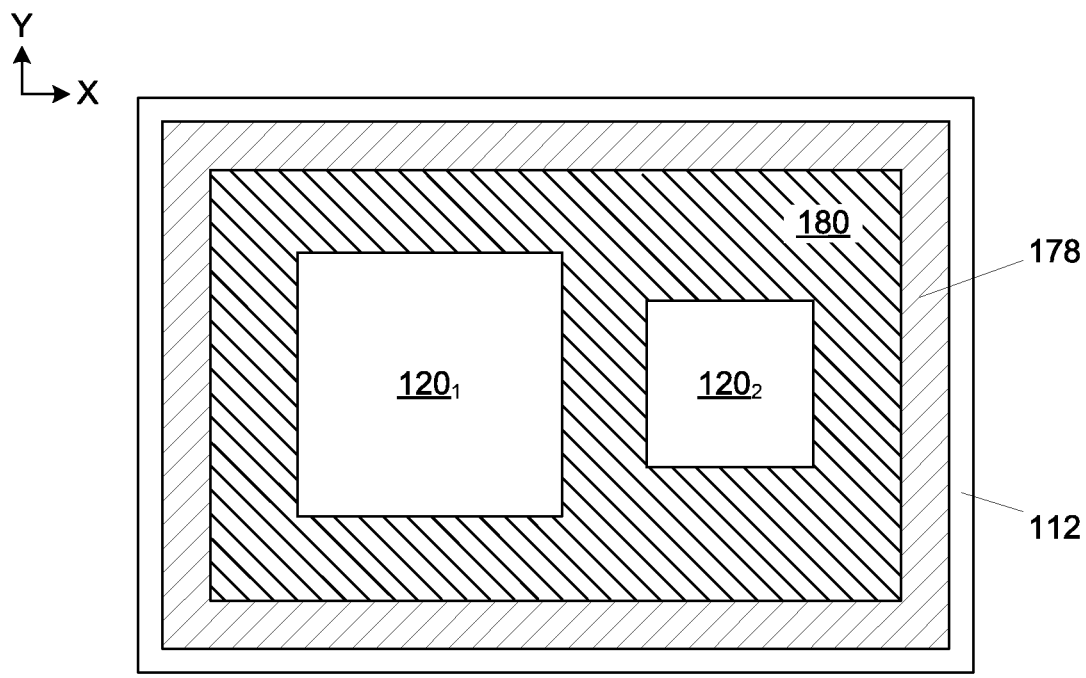

Although the heat dissipation device 160 of FIG. 1 is illustrated as a cold plate type, the embodiments of the present description are not so limited, and may be any appropriate configuration. For example, the heat dissipation device 160 may be an integrated heat spreader, as shown in FIGS. 5 and 6. In one embodiment of the present description, the heat dissipation device 160 may comprise a main body 172, having a first surface 174 and an opposing second surface 176, and at least one boundary wall 178 extending from the first surface 174 of the main body 172 of the heat dissipation device 160. The at least one boundary wall 178 may be attached or sealed to the first surface 112 of the electronic substrate 110 with the attachment adhesive or sealant layer 152. The heat dissipation device 160 may be made of any appropriate thermally conductive material, including, but not limited to, at least one metal material and alloys of more than one metal, or highly doped glass or highly conductive ceramic material, such as aluminum nitride. In a specific embodiment of the present description, the heat dissipation device 170 may comprise copper, nickel, aluminum, alloys thereof, laminated metals including coated materials (such as nickel coated copper), and the like.

As illustrated in FIG. 5, the heat dissipation device 160 may be a single material throughout, such as when the heat dissipation device 160 including the heat dissipation boundary wall 178 is formed by a single process step, including but not limited to, stamping, skiving, molding, and the like. However, embodiments of the present description may also include heat dissipation device 160 made of more than one component. For example, the heat dissipation device boundary wall 178 may be formed separately from the main body 172, then attached together to form the heat dissipation device 170. In one embodiment shown in FIG. 6, the boundary wall 178 may be a single "picture frame" structure surrounding the first integrated circuit device 120$_1$ and the second integrated circuit device 120$_2$.

The attachment adhesive 152 may be any appropriate material, including, but not limited to, silicones (such as polydimethylsiloxane), epoxies, and the like. It is understood that the boundary wall 178 not only secures the heat dissipation device 170 to the substrate 140, but also maintains a desired distance (e.g. bond line thickness $BLT_1$ and $BLT_2$) between the first surface 174 of the heat dissipation device 170 and second surfaces 124$_1$, 124$_2$ of the integrated circuit devices 120$_1$, 120$_2$, respectively.

Figure 7:
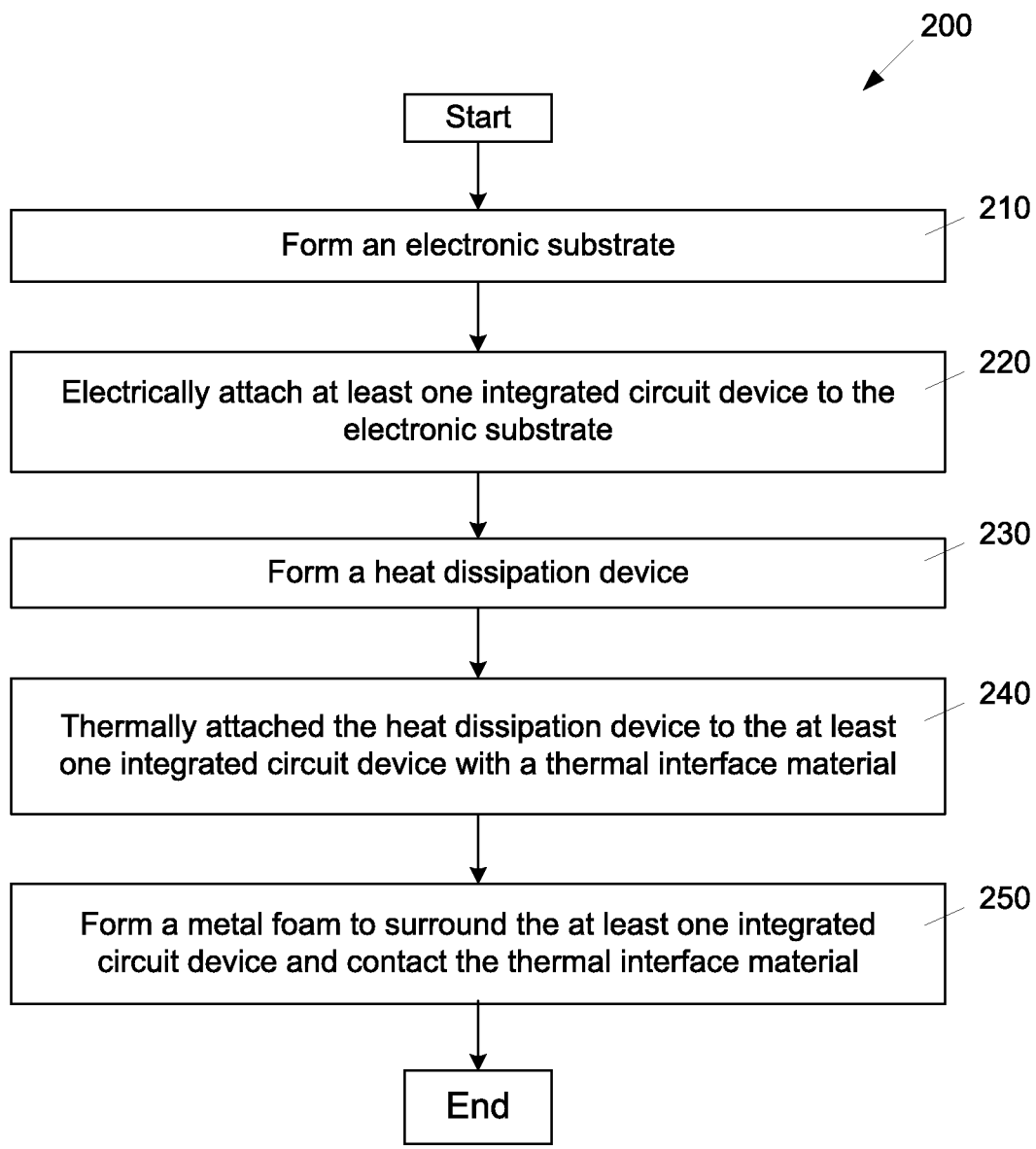
FIG. 7 is a flow chart of a process of fabricating an integrated circuit package, according to an embodiment of the present description.

FIG. 7 is a flow chart of a process 200 of fabricating an integrated circuit assembly according to an embodiment of the present description. As set forth in block 210, an electronic substrate may be formed. At least one integrated circuit device may be electrically attached to the electronic substrate, as set forth in block 220. As set forth in block 230, a heat dissipation device may be formed. The heat dissipation device may be thermally attached to the at least one integrated circuit device with a thermal interface material, as set forth in block 240. As set forth in block 250, a metal foam may be formed to surround the at least one integrated circuit device and contact the thermal interface material layer.

Figure 8:
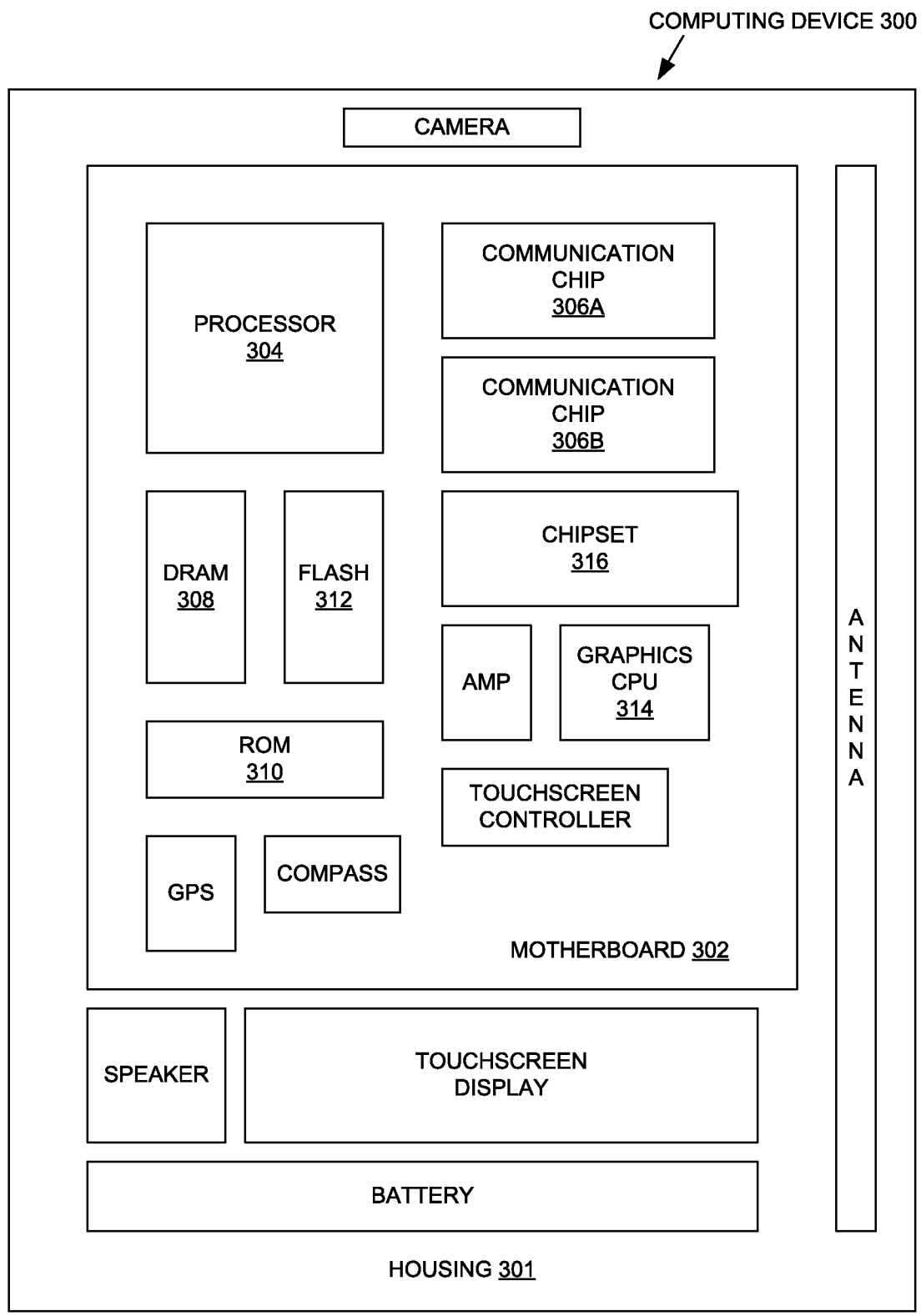
FIG. 8 is an electronic system, according to one embodiment of the present description.

FIG. 8 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit assembly comprising an electronic substrate, at least one integrated circuit device electrically attached to the electronic substrate, a heat dissipation device, a thermal interface material between the at least one integrated circuit device and the heat dissipation device, and a metal foam surrounding the at least one integrated circuit device and contacting the thermal interface material.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-8. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an integrated circuit assembly, comprising an electronic substrate, at least one integrated circuit device electrically attached to the electronic substrate, a heat dissipation device, a thermal interface material between the at least one integrated circuit device and the heat dissipation device, and a metal foam surrounding the at least one integrated circuit device and contacting the thermal interface material.

In Example 2, the subject matter of Example 1 can optionally include a stiffener attached to the electronic substrate, wherein the metal foam is disposed between the stiffener, the at least one integrated circuit device, the electronic substrate, and the heat dissipation device.

In Example 3, the subject matter of any of Examples 1 to 2 can optionally include the metal foam comprising a solid metal matrix structure having a plurality of cells.

In Example 4, the subject matter of any of Examples 1 to 2 can optionally include the metal foam comprising a non-metallic matrix having a plurality of cells and a metal coated on the non-metallic matrix.

In Example 5, the subject matter of any of Examples 1 to 4 can optionally include at least one integrated circuit device comprises a first surface, an opposing second surface, and at least one side extending between the first surface and the second surface of the at least one integrated circuit device, and wherein the metal foam contacts the at least one side of the at least one integrated circuit.

In Example 6, the subject matter of any of Examples 1 and 3 to 5 can optionally include the heat dissipation device includes a main body having a first surface and a boundary wall extending from the first surface of the main body of the heat dissipation device, and wherein the boundary wall is attached to the electronic substrate.

In Example 7, the subject matter of any of Examples 1 to 6 can optionally include the metal foam being an open cell foam.

In Example 8, the subject matter of any of Examples 1 to 6 can optionally include the metal foam being a closed cell foam.

Example 9 is an electronic system, comprising a board and an integrated circuit package electrically attached to the board, wherein the integrated circuit package comprises an integrated circuit assembly, comprising an electronic substrate, at least one integrated circuit device electrically attached to the electronic substrate, a heat dissipation device, a thermal interface material between the at least one integrated circuit device and the heat dissipation device, and a metal foam surrounding the at least one integrated circuit device and contacting the thermal interface material.

In Example 10, the subject matter of Example 9 can optionally include a stiffener attached to the electronic substrate, wherein the metal foam is disposed between the stiffener, the at least one integrated circuit device, the electronic substrate, and the heat dissipation device.

In Example 11, the subject matter of any of Examples 9 to 10 can optionally include the metal foam comprising a solid metal matrix structure having a plurality of cells.

In Example 12, the subject matter of any of Examples 9 to 10 can optionally include the metal foam comprising a non-metallic matrix having a plurality of cells and a metal coated on the non-metallic matrix.

In Example 13, the subject matter of any of Examples 9 to 12 can optionally include at least one integrated circuit device comprises a first surface, an opposing second surface, and at least one side extending between the first surface and the second surface of the at least one integrated circuit device, and wherein the metal foam contacts the at least one side of the at least one integrated circuit.

In Example 14, the subject matter of any of Examples 9 and 11 to 13 can optionally include the heat dissipation device includes a main body having a first surface and a boundary wall extending from the first surface of the main body of the heat dissipation device, and wherein the boundary wall is attached to the electronic substrate.

In Example 15, the subject matter of any of Examples 9 to 14 can optionally include the metal foam being an open cell foam.

In Example 16, the subject matter of any of Examples 9 to 14 can optionally include the metal foam being a closed cell foam.

Example 17 is a method of fabricating an integrated circuit assembly, comprising forming an electronic substrate, electrically attaching at least one integrated circuit device to the electronic substrate, forming a heat dissipation device, thermally attaching the heat dissipation device to the at least one integrated circuit device with a thermal interface material, and forming a metal foam to surround the at least one integrated circuit device and contact the thermal interface material.

In Example 18, the subject matter of Example 17 can optionally include attaching a stiffener to the electronic substrate, wherein the metal foam is disposed between the stiffener, the at least one integrated circuit device, the electronic substrate, and the heat dissipation device.

In Example 19, the subject matter of any of Examples 17 to 18 can optionally include the metal foam comprising a solid metal matrix structure having a plurality of cells.

In Example 20, the subject matter of any of Examples 17 to 18 can optionally include the metal foam comprising a non-metallic matrix having a plurality of cells and a metal coated on the non-metallic matrix.

In Example 21, the subject matter of any of Examples 17 to 20 can optionally include at least one integrated circuit device comprises a first surface, an opposing second surface, and at least one side extending between the first surface and the second surface of the at least one integrated circuit device, and wherein the metal foam contacts the at least one side of the at least one integrated circuit.

In Example 22, the subject matter of any of Examples 17 and 19 to 21 can optionally include the heat dissipation device includes a main body having a first surface and a boundary wall extending from the first surface of the main body of the heat dissipation device, and wherein the boundary wall is attached to the electronic substrate.

In Example 23, the subject matter of any of Examples 17 to 22 can optionally include the metal foam being an open cell foam.

In Example 24, the subject matter of any of Examples 17 to 22 can optionally include the metal foam being a closed cell foam.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit assembly, comprising:
an electronic substrate;
at least one integrated circuit device electrically attached to the electronic substrate;
a heat dissipation device;
a thermal interface material between the at least one integrated circuit device and the heat dissipation device; and
a metal foam surrounding the at least one integrated circuit device and contacting the thermal interface material.

2. The integrated circuit assembly of claim 1, further comprising a stiffener attached to the electronic substrate, wherein the metal foam is disposed between the stiffener, the at least one integrated circuit device, the electronic substrate, and the heat dissipation device.

3. The integrated circuit assembly of claim 1, wherein the metal foam comprises a solid metal matrix having a plurality of cells.

4. The integrated circuit assembly of claim 1, wherein the metal foam comprises a non-metallic matrix having a plurality of cells and a metal coated on the non-metallic matrix.

5. The integrated circuit assembly of claim 1, wherein the at least one integrated circuit device comprises a first surface, an opposing second surface, and at least one side extending between the first surface and the second surface of the at least one integrated circuit device, and wherein the metal foam contacts the at least one side of the at least one integrated circuit.

6. The integrated circuit assembly of claim 1, wherein the heat dissipation device includes a main body having a first surface and a boundary wall extending from the first surface of the main body of the heat dissipation device, and wherein the boundary wall is attached to the electronic substrate.

7. The integrated circuit assembly of claim 1, wherein the metal foam is open cell.

8. The integrated circuit assembly of claim 1, wherein the metal foam is closed cell.

9. An electronic system, comprising:
a housing;
a motherboard disposed within the housing;
an integrated circuit assembly electrically attached to a first surface of the motherboard, wherein the integrated circuit assembly comprises:
an electronic substrate;
at least one integrated circuit device electrically attached to the electronic substrate;
a heat dissipation device;
a thermal interface material between the at least one integrated circuit device and the heat dissipation device; and
a metal foam surrounding the at least one integrated circuit device and contacting the thermal interface material.

10. The electronic system of claim 9, further comprising a stiffener attached to the electronic substrate, wherein the metal foam is disposed between the stiffener, the at least one integrated circuit device, the electronic substrate, and the heat dissipation device.

11. The electronic system of claim 9, wherein the metal foam comprises a solid metal matrix having a plurality of cells.

12. The electronic system of claim 9, wherein the metal foam comprises a non-metallic matrix having a plurality of cells and a metal coated on the non-metallic matrix.

13. The electronic system of claim 9, wherein the at least one integrated circuit device comprises a first surface, an opposing second surface, and at least one side extending between the first surface and the second surface of the at least one integrated circuit device, and wherein the metal foam contacts the at least one side of the at least one integrated circuit.

14. The electronic system of claim 9, wherein the heat dissipation device includes a main body having a first surface and a boundary wall extending from the first surface of the main body of the heat dissipation device, and wherein the boundary wall is attached to the electronic substrate.

15. A method of fabricating an integrated circuit assembly, comprising:
forming an electronic substrate;
electrically attaching at least one integrated circuit device to the electronic substrate;
forming a heat dissipation device;

thermally attaching the heat dissipation device to the at least one integrated circuit device with a thermal interface material; and forming a metal foam to surround the at least one integrated circuit device and contact the thermal interface material.

16. The method of claim 15, further comprising attaching a stiffener to the electronic substrate, and wherein forming the metal foam further comprises disposing the metal foam between the stiffener, the at least one integrated circuit device, the electronic substrate, and the heat dissipation device.

17. The method of claim 15, wherein forming the metal foam comprises forming a solid metal matrix having a plurality of cells.

18. The method of claim 15, wherein forming the metal foam comprises forming a non-metallic matrix having a plurality of cells and a metal coated on the non-metallic matrix.

19. The method of claim 15, wherein forming the at least one integrated circuit device comprises forming the at least one integrated circuit device having a first surface, an opposing second surface, and at least one side extending between the first surface and the second surface of the at least one integrated circuit device, and further comprising contacting the metal foam with the at least one side of the at least one integrated circuit.

20. The method of claim 15, wherein forming the heat dissipation device includes forming a main body having a first surface and forming a boundary wall extending from the first surface of the main body of the heat dissipation device, and attaching the boundary wall to the electronic substrate.

\* \* \* \* \*